United States Patent
Tamadate (10) Patent No.: US 7,825,499 B2
(45) Date of Patent: Nov. 2, 2010

(54) SEMICONDUCTOR PACKAGE AND TRENCHED SEMICONDUCTOR POWER DEVICE USING THE SAME

(75) Inventor: Yuka Tamadate, Nagano (JP)

(73) Assignee: Shinko Electric Industries Co., Ltd., Nagano-Shi (JP)

( * ) Notice: Subject to any disclaimer, the term of this patent is extended or adjusted under 35 U.S.C. 154(b) by 7 days.

(21) Appl. No.: 12/146,924

(22) Filed: Jun. 26, 2008

(65) Prior Publication Data

US 2009/0001606 A1    Jan. 1, 2009

(30) Foreign Application Priority Data

Jun. 27, 2007    (JP) ............................. 2007-168495

(51) Int. Cl.
- H01L 23/495    (2006.01)
- H01L 23/02    (2006.01)
- H01L 23/48    (2006.01)
- H01L 23/52    (2006.01)
- H01L 29/40    (2006.01)

(52) U.S. Cl. ........................ 257/667; 257/737; 257/738; 257/686; 257/777; 257/778

(58) Field of Classification Search ................. 257/667, 257/673, 678, 686, 723, 777, 778, 737, 738, 257/780
See application file for complete search history.

(56) References Cited

U.S. PATENT DOCUMENTS

| | | | | |
|---|---|---|---|---|
| 5,220,200 A * | 6/1993 | Blanton | ........................ | 257/778 |
| 5,311,060 A * | 5/1994 | Rostoker et al. | ............ | 257/796 |
| 5,436,203 A * | 7/1995 | Lin | ............................ | 29/841 |
| 5,608,265 A * | 3/1997 | Kitano et al. | ................ | 257/738 |
| 5,973,393 A * | 10/1999 | Chia et al. | .................. | 257/690 |
| 6,310,421 B2 * | 10/2001 | Morishima | .............. | 310/313 R |
| 6,493,229 B2 * | 12/2002 | Akram et al. | ................ | 361/704 |
| 6,566,746 B2 * | 5/2003 | Isaak et al. | .................... | 257/685 |
| 6,600,224 B1 * | 7/2003 | Farquhar et al. | ............ | 257/731 |
| 6,798,057 B2 * | 9/2004 | Bolkin et al. | ............... | 257/686 |
| 6,849,955 B2 * | 2/2005 | Ho et al. | ..................... | 257/778 |
| 6,905,954 B2 * | 6/2005 | Hedler et al. | ............... | 438/612 |
| 7,138,709 B2 * | 11/2006 | Kumamoto | ................. | 257/686 |
| 7,176,559 B2 * | 2/2007 | Ho et al. | ..................... | 257/678 |
| 7,405,478 B2 * | 7/2008 | Ishikawa et al. | ............. | 257/737 |
| 2001/0054753 A1 * | 12/2001 | Oya | ........................... | 257/676 |
| 2004/0012097 A1 * | 1/2004 | Chang et al. | ................. | 257/778 |
| 2004/0212056 A1 * | 10/2004 | Chen et al. | .................. | 257/678 |
| 2006/0103030 A1 * | 5/2006 | Aoki et al. | ................... | 257/778 |
| 2006/0231939 A1 * | 10/2006 | Kawabata et al. | ........... | 257/686 |
| 2007/0023904 A1 * | 2/2007 | Salmon | ...................... | 257/737 |

FOREIGN PATENT DOCUMENTS

JP    2006-351559    12/2006

* cited by examiner

*Primary Examiner*—Leonardo Andújar
*Assistant Examiner*—Teresa M Arroyo
(74) *Attorney, Agent, or Firm*—Rankin, Hill & Clark LLP (57) ABSTRACT

A semiconductor package 60 in which a region where a land pad 18 is formed is provided on an outer side of a region in which a flip-chip connecting pad 16 is formed, wherein a protecting member 39 is formed to expose the land pad 18 in the region in which the land pad 18 is formed, and the protecting member 39 includes a frame-shaped structure portion 39A disposed to surround the flip-chip connecting pad 16 and a support film portion 39B disposed on an outer side of the frame-shaped structure portion 39A, and a semiconductor device 70 using the semiconductor package 60.

7 Claims, 7 Drawing Sheets

SEMICONDUCTOR PACKAGE AND TRENCHED SEMICONDUCTOR POWER DEVICE USING THE SAME

BACKGROUND OF THE INVENTION

The present invention relates to a semiconductor package and a semiconductor device using the semiconductor package, and more particularly to a semiconductor package including a flip-chip connecting pad and a land pad to be used for a BGA (Ball Grid Array) or LGA (Land Grid Array) connection, and a semiconductor device using the semiconductor package.

In a semiconductor package to be used for a portable telephone or a digital camera and a semiconductor device using the semiconductor package, an increase in a density and a reduction in a size have been desired. In an assembling technique of the semiconductor package and the semiconductor device which have densities increased and sizes reduced, a flip-chip connecting structure of a semiconductor chip is employed as effective means.

In the flip-chip connecting structure, an interval between the semiconductor chip and a substrate of the semiconductor package in a chip mounting area is very small, that is, approximately 30 μm in a high density connecting structure. For this reason, a resin having a low viscosity is used for an underfill resin.

In the case in which the underfill resin having a low viscosity is used, the underfill resin flows out of a flip-chip connecting region more or less. Conventionally, an appearance is slightly deteriorated and can be disregarded. When the size of the semiconductor chip itself is reduced and mounting densities of the semiconductor chip and other electronic components are increased, however, there is a possibility that the flow-out of the underfill resin might adversely influence the peripheral chip and electronic components.

In recent years, there is a laminating type semiconductor device formed by mounting another semiconductor device on a semiconductor device having a semiconductor element flip-chip connected and connecting the semiconductor devices to each other through an LGA connection. In the semiconductor device, there is required a method of forming a dam for preventing the flow-out of an underfill resin through a protecting resist layer provided to surround a chip mounting region in such a manner that the underfill resin does not flow to a BGA connecting or LGA connecting land pad disposed on an outer side of a chip mounting region of a semiconductor package.

[Patent Document 1] JP-A-2006-351559

Figure 14:
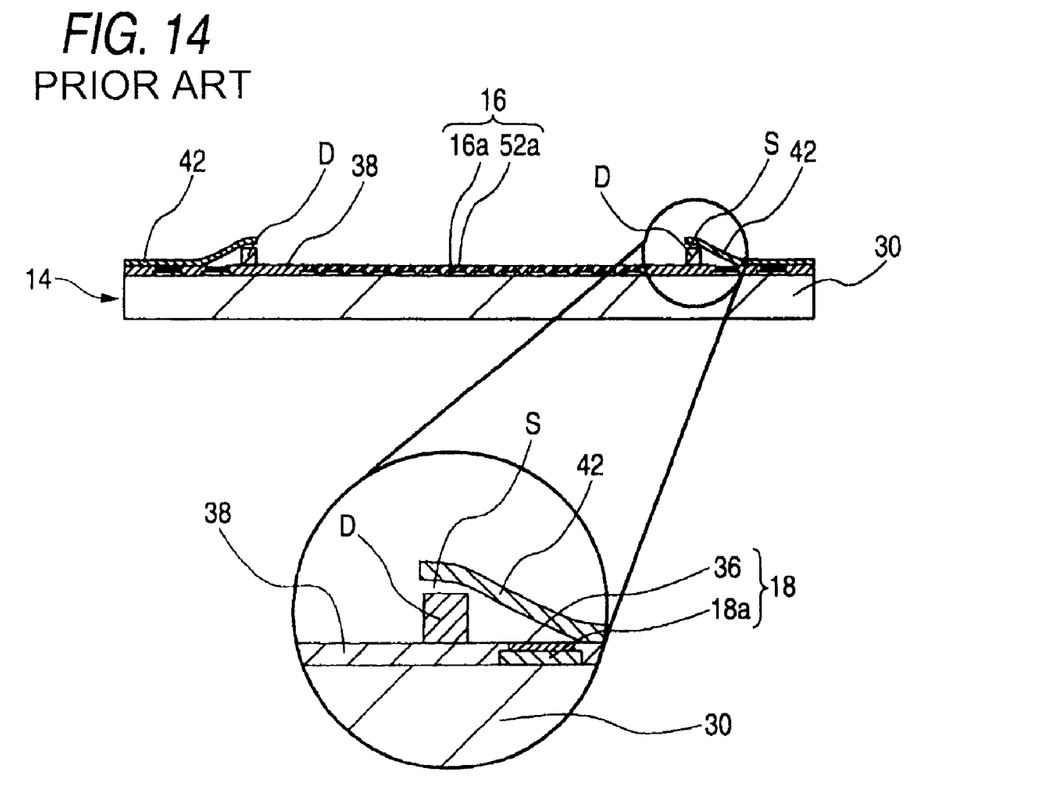
FIG. 14 is an explanatory view showing a step in the middle of a manufacture of a semiconductor package including a flip-chip connecting pad and a BGA or LGA connecting land pad.

FIG. 14 is an explanatory view showing a step in the middle of a manufacture of a semiconductor package including a flip-chip connecting pad and a BGA or LGA connecting land pad.

A bump 12 (gold bump) formed on a semiconductor element 10 (see FIG. 12) is bonded to a flip-chip connecting pad 16, while a solder ball or a connecting pin is connected to a BGA connecting or LGA connecting land pad 18. For this reason, a solder is clad to a surface of a copper pad in the flip-chip connecting pad 16. Also in the BGA connecting or LGA connecting land pad 18, moreover, a copper pad can also be used. In order to cause the land pad 18 to be more suitable, however, it is desirable that a plating 36 (for example, a nickel plating and a gold plating) should be applied to the surface of the copper pad.

In the case in which the nickel plating and the gold plating are applied to the land pad 18, a wiring pattern, the flip-chip connecting pad 16 and the land pad 18 are formed on a surface of a substrate 14, and subsequently, the plating 36 is first applied to a pad portion serving as the land pad 18 and a solder 52a is thus clad to a pad portion serving as the flip-chip connecting pad 16 at a step of forming the substrate 14.

More specifically, a pad portion 16a serving as the flip-chip connecting pad 16 is coated with a plating resist to apply the plating 36 when the plating 36 is to be applied to a pad portion 18a serving as the land pad 18, and a masking tape 42 is stuck to the land pad 18 and the land pad 18 is thus coated when the pad portion 16a serving as the flip-chip connecting pad 16 is to be solder coated with a solder powder 52.

The land pad 18 is provided in an outer region surrounding a region in which the flip-chip connecting pad 16 is formed, and a dam D is formed by a protecting resist layer to surround the region in which the flip-chip connecting pad 16 is formed. The dam D serves to prevent an underfill resin 37 (see FIG. 12) from flowing to a region in which the land pad 18 is formed and is provided to be protruded upward from a resin substrate 30 or a solder resist 38. As described above, the masking tape 42 is stuck to shield the land pad 18. However, the masking tape 42 cannot be flatly stuck into the region in which the land pad 18 is formed because the dam D is formed. For this reason, there is a problem in that a clearance S is generated between the masking tape 42 and the region in which the land pad 18 is formed as shown in FIG. 14. In the case in which the pad portion 16a serving as the flip-chip connecting pad 16 is solder coated with the solder powder 52, a sticky solution is adhered to the pad portion 16a. When the sticky solution is supplied in this state, accordingly, the sticky solution flows from the clearance S between the region in which the land pad 18 is formed and the masking tape 42 into the region in which the land pad 18 is formed or the solder powder 52 is adhered to the land pad 18 so that the plating 36 on the surface of the land pad 18 cannot be protected, resulting in a defective product.

SUMMARY OF THE INVENTION

Therefore, the invention has been made to solve the problems and has an object to provide a semiconductor package having connecting pads obtained through different connecting methods including a flip-chip connection and a BGA connection or an LGA connection and a semiconductor device using the semiconductor package, in which a surface treatment in each of the connecting pads can be reliably carried out and a production efficiency is high.

According to a first aspect of the invention, there is provided a semiconductor package including:

a region in which a land pad is formed, a region in which a flip-chip connecting pad is formed, the region in which a land pad is formed being provided on an outer side of a region in which a flip-chip connecting pad is formed, and a protecting member formed to expose the land pad in the region in which the land pad is formed, wherein the protecting member includes:

a frame-shaped structure portion disposed to surround the flip-chip connecting pad, and a support film portion disposed on an outer side of the frame-shaped structure portion.

According to a second aspect of the invention, there is provided the semiconductor package according to the first aspect, wherein the support film portion is formed like a frame surrounding the frame-shaped structure portion from the outer side.

According to a third aspect of the invention, there is provided the semiconductor package according to the first aspect, wherein the support film portion is formed like a scattered point on the outer side of the frame-shaped structure portion.

According to a forth aspect of the invention, there is provided the semiconductor package according to any one of the first to third aspects, wherein the support film portion is formed on an outer side of an outermost peripheral position of the land pad.

By employing the structure, it is possible to stick a masking tape without a clearance to the region in which the land pad for carrying out a BGA connection or an LGA connection is formed. Therefore, a yield of the semiconductor package can be enhanced so that a manufacturing cost of the semiconductor package can be reduced.

Further, according to a fifth aspect of the invention, there is provided the semiconductor package according to any one of the first to forth aspects, wherein the frame-shaped structure portion and the support film portion are formed in equal heights to each other.

Consequently, it is easy to flatly stick the masking tape without the clearance to the region in which the land pad for carrying out the BGA connection or the LGA connection is formed. Therefore, the yield of the semiconductor package can further be enhanced. In addition, the manufacturing cost of the semiconductor package can further be reduced.

In addition, according to a sixth aspect of the invention, there is provided a semiconductor device in which a semiconductor element is mounted on the semiconductor package according to any one of the first to fifth aspects, wherein the semiconductor element mounted on the semiconductor package is connected through a flip-chip connection.

Furthermore, according to a seventh aspect of the invention, there is provided a semiconductor device, wherein the semiconductor devices according to the sixth aspect are laminated in a vertical direction, and an external connecting terminal in the semiconductor device on an upper layer side is connected to a land pad in the semiconductor device on a lower layer side.

Furthermore, a semiconductor package of a different type may be laminated on the semiconductor package according to the invention.

According to the semiconductor package and the semiconductor device using the semiconductor package in accordance with the invention, even if the frame-shaped structure portion for preventing an underfill resin from flowing out in a semiconductor package having different connecting portions through a flip-chip connection and a BGA connection or an LGA connection and a semiconductor device using the semiconductor package, it is possible to reliably carry out a surface treatment in each of the connecting pads. Moreover, the support film portion is formed through a solder resist in the region in which the land pad is formed. Consequently, it is possible to relieve a warpage of each of the semiconductor package and the semiconductor device. Thus, it is possible to obtain a semiconductor package and a semiconductor device which have small sizes and high quality.

DETAILED DESCRIPTION OF THE PREFERRED EMBODIMENTS

A preferred embodiment according to the invention will be described below in detail with reference to the accompanying drawings. FIGS. 1 to 10 are sectional views showing a process for manufacturing a semiconductor package according to the embodiment. FIG. 11 includes a plan view (FIG. 11A) showing a semiconductor package according to the embodiment and a sectional view (FIG. 11B) taken along an A-A line in the plan view. The sectional views in FIGS. 1 to 10 are taken along the A-A line in FIG. 11A.

Figure 1:
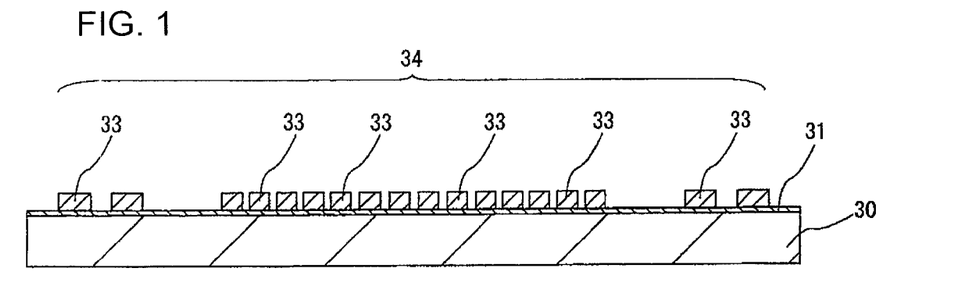
FIG. 1 is a sectional view showing a state in which a resist pattern is formed on a resin substrate having a single side clad with copper.

FIG. 1 is a sectional view showing a state in which a resist pattern is formed on a resin substrate having a single side clad with copper. A resist pattern 34 is formed by cladding a resist film 33 to a copper foil 31 stuck to a resin substrate 30 and exposing and developing the resist film 33. The resist pattern 34 is formed to coat a predetermined wiring pattern which is not shown, and pattern portions of a flip-chip connecting pad 16 and a land pad 18 for carrying out a BGA connection or an LGA connection.

Figure 2:
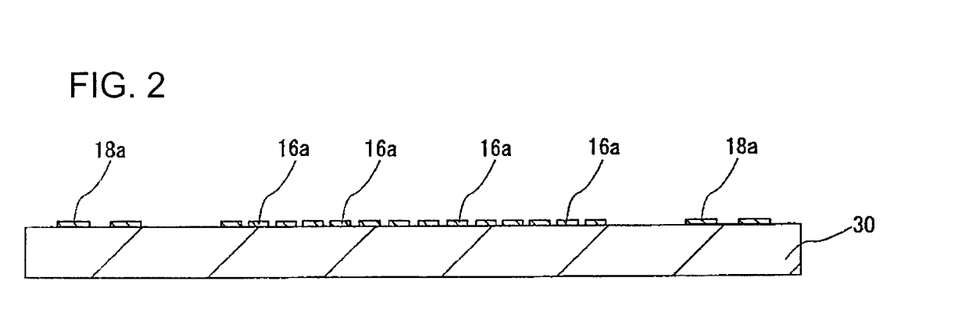
FIG. 2 is a sectional view showing a state in which a wiring pattern is formed on a resin substrate, and at the same time, pads serving as a flip-chip connecting pad and a land pad are formed.

FIG. 2 is a sectional view showing a state in which the wiring pattern is formed on the resin board, and at the same time, pads serving as the flip-chip connecting pad and the land pad are formed. After the resist pattern 34 is formed, the copper foil is etched by using the resist pattern as a mask so that the wiring pattern, a pad portion 16a serving as the flip-chip connecting pad 16, and a pad portion 18a serving as the land pad 18 are formed. After the etching, the resist pattern 34 is removed.

Figure 3:
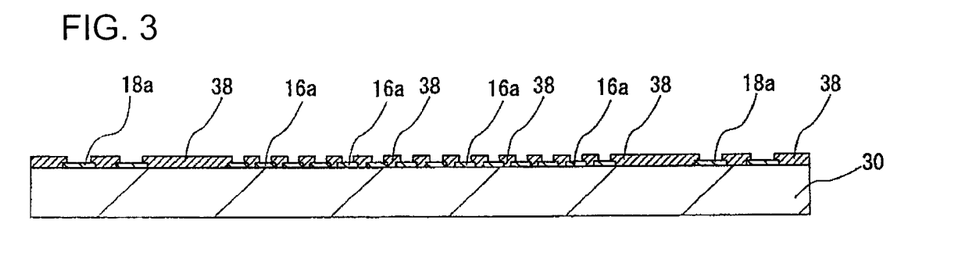
FIG. 3 is a sectional view showing a state in which a solder resist is clad with only the pad portion serving as the flip-chip connecting pad and the land pad exposed to a surface of the resin substrate.

FIG. 3 is a sectional view showing a state in which a solder resist is clad with only the pad portion serving as the flip-chip connecting pad and the land pad exposed from the surface of the resin substrate. The surface of the resin substrate 30 is coated with a solder resist 38, and exposure and development are carried out to expose only the pad portion 16a serving as the flip-chip connecting pad 16 and the pad portion 18*a* serving as the land pad 18 from the surface of the resin substrate 30.

Figure 4:
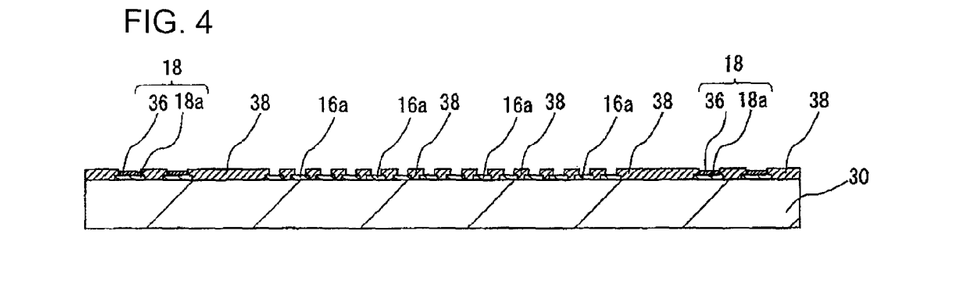
FIG. 4 is a sectional view showing a state in which a plating is applied to the pad portion serving as the land pad to form the land pad.

FIG. 4 is a sectional view showing a state in which plating is carried out over the pad portion serving as the land pad to form the land pad. In the embodiment, a nickel plating and a gold plating are applied in this order as a plating 36. When the plating is to be applied to the pad portion 18*a* serving as the land pad 18, a region in which the pad portion 16*a* is formed is shielded with a mask and is thus plated in such a manner that a plating solution is not stuck to the pad portion 16*a* serving as the flip-chip connecting pad 16, which is not shown. As the mask, it is possible to use a plating resist, for example.

Figure 5:
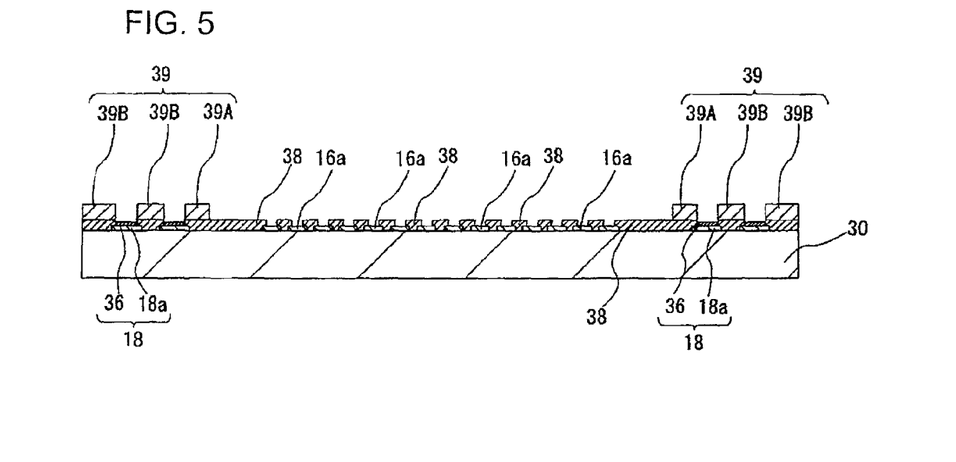
FIG. 5 is a sectional view showing a state in which a frame-shaped structure portion and a support film portion are formed in an arrangement surrounding a region in which the flip-chip connecting pad is disposed in a region in which the land pad is formed.

FIG. 5 is a sectional view showing a state in which a frame-shaped structure portion and a support film portion are formed in an arrangement surrounding a region in which the flip-chip connecting pad is disposed in a region in which the land pad is formed. An upper surface of the solder resist 38 in the region in which the land pad 18 is disposed is coated with a solder resist 39 to be a second layer which serves as a protecting member, and a frame-shaped structure portion 39A for preventing an underfill resin 37 from flowing out and a support film portion 39B having an equal height to that of the frame-shaped structure portion 39A are formed at the same time. The frame-shaped structure portion 39A is provided along a circumference of a region in which the pad portion 16*a* is formed, and the support film portion 39B has an equal height to that of the frame-shaped structure portion 39A and is formed like a frame seen on a plane so as to surround the frame-shaped structure portion 39A.

As shown in FIG. 5, the frame-shaped structure portion 39A is formed in a sufficient height and width for preventing the underfill resin 37 from flowing out. Moreover, the support film portion 39B is formed like the frame in an equal thickness to that of the frame-shaped structure portion 39A in the region in which the connecting pad 18 is formed. Consequently, it is possible to suppress warpages of a semiconductor package 60 (see FIGS. 11A and 11B) and a semiconductor device 70 using the semiconductor package 60 (see FIG. 12). Thus, it is possible to provide the semiconductor package 60 and the semiconductor device 70 which have high degrees of flatness.

Figure 12:
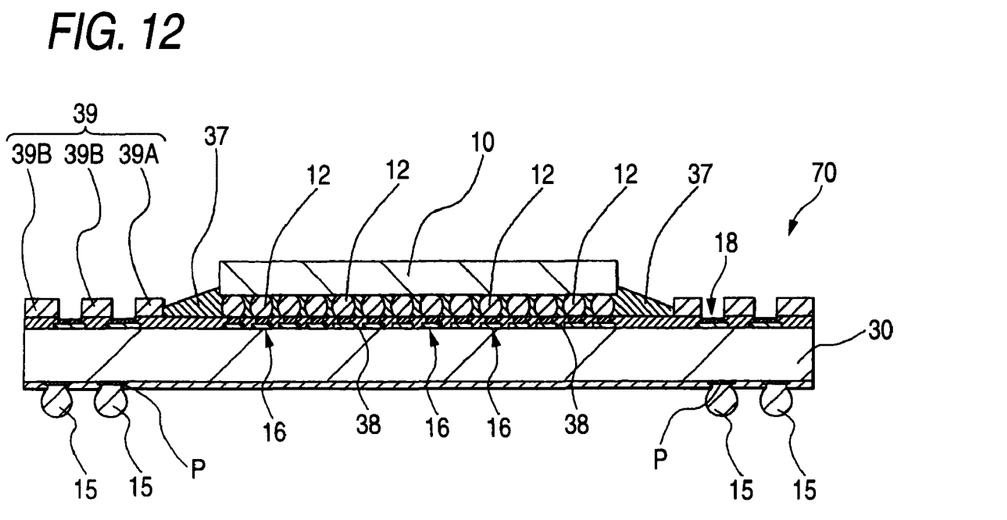
FIG. 12 is a sectional view showing an example of a structure of a semiconductor device using the semiconductor package according to the embodiment.

More specifically, it has been known that the semiconductor device 70 is deformed to take an upward convex shape when the semiconductor device 70 is seen from a front side in a state in which a semiconductor element 10 is turned to an upper side after the flip-chip connection. By applying the solder resist 38 to a substrate of the semiconductor package 60 twice, therefore, it is possible to increase a stress for deforming the semiconductor device 70 to take a convex shape. Thus, it is possible to relieve the warpage generated on the semiconductor device 70.

Figure 6:
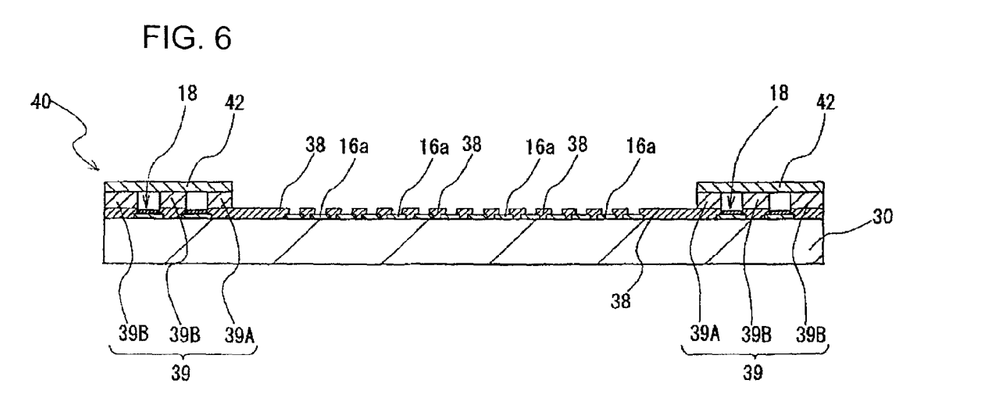
FIG. 6 is a sectional view showing a state in which the region where the land pad is formed is masked with a masking tape.

FIG. 6 is a sectional view showing a state in which the region in which the land pad is formed is masked with a masking tape. A masking tape 42 is used for preventing the solder powder from being stuck to the surface of the land pad 18 when the solder is clad to the surface of the pad portion 16*a*. As shown in FIG. 6, the surfaces of the frame-shaped structure portion 39A and the support film portion 39B are positioned on an upper side of the surface of the land pad 18. Therefore, the masking tape 42 is adhered to the upper surfaces of the frame-shaped structure portion 39A and the support film portion 39B respectively so as to be laid between the frame-shaped structure portion 39A and the support film portion 39B.

In order to reliably cover, with the masking tape 42, the region in which the land pad 18 is formed, it is preferable to dispose at least one support film portion 39B in a position at a further outer side from the position in which the outermost land pad 18 is provided.

In the masking tape 42 used in the embodiment, a base material is formed by a polyvinyl chloride based resin and an adhesive is formed by an acrylic resin. A sticking layer of the masking tape 42 is formed by a material which hinders neither the BGA connection nor the LGA connection even if the adhesive remains in the land pad 18. Since the masking tape 42 is stuck apart from the surface of the land pad 18 as shown in FIG. 6, however, the adhesive is not stuck to the surface of the land pad 18.

For use, the masking tape 42 is actually peeled from a separator formed by a resin film and is stuck to a target. By adhering the masking tape 42 to the surfaces of the frame-shaped structure portion 39A and the support film portion 39B respectively, the land pad 18 is sealed from an outer side.

Figure 7:
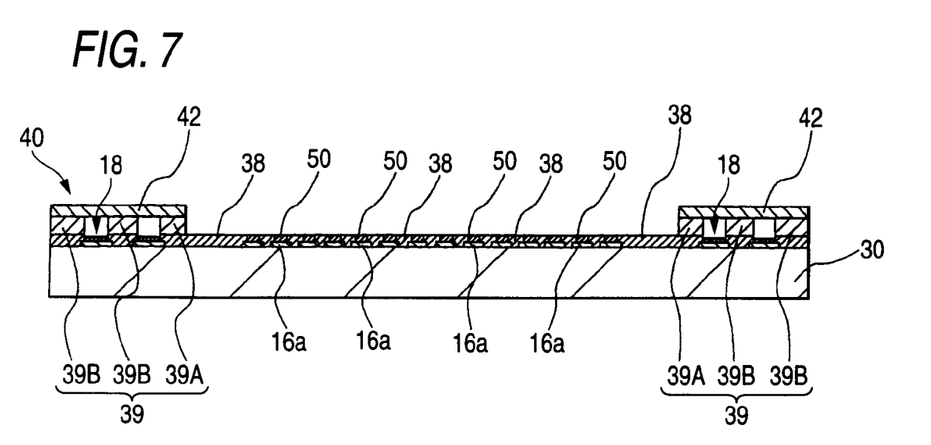
FIG. 7 is a sectional view showing a state in which a sticking layer is formed on a surface of the flip-chip connecting pad.

Next, the solder is clad to the surface of the pad serving as the flip-chip connecting pad. First of all, a sticking layer 50 is formed on the surface of the pad portion 16*a* serving as the flip-chip connecting pad 16 in a workpiece 40 shown in FIG. 6. The sticking layer 50 is formed by immersing the workpiece 40 into a solution vessel for an adhesive constituted by an acrylic compound to adhere the adhesive to the surface of the pad portion 16*a*. A sticking solution is selectively adhered to the surface of the pad portion 16*a* formed of copper. However, the land pad 18 is coated with the masking tape 42. Even if the workpiece 40 is immersed into the solution vessel of the adhesive, therefore, the solution of the adhesive is not stuck to the land pad 18. FIG. 7 is a sectional view showing a state in which the treatment is carried out.

Figure 8:
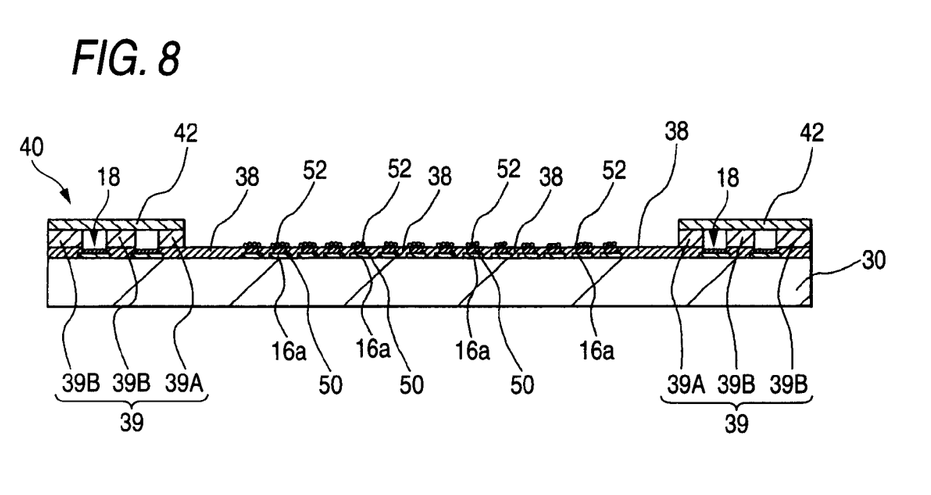
FIG. 8 is a sectional view showing a state in which a solder powder is stuck to the pad portion serving as the flip-chip connecting pad.

Next, a solder powder 52 is stuck to the pad portion 16*a* serving as the flip-chip connecting pad 16 (which will be hereinafter referred to as the pad portion 16*a* in some cases). FIG. 8 is a sectional view showing a state in which the solder powder is stuck to the pad portion serving as the flip-chip connecting pad. The solder powder 52 is sprinkled from above the workpiece 40 and is thus stuck to the surface of the pad portion 16*a*. The solder powder 52 dropped onto the pad portion 16*a* is stuck to the surface of the pad portion 16*a* through the sticking layer 50. The solder powder 52 dropped onto the surface of the substrate in addition to the pad portion 16*a* is removed at a cleaning step. Also at the cleaning step, since the land pad 18 is coated with the masking tape 42, there is no hindrance. In the embodiment, the solder powder 52 formed of Sn—Ag is used.

The solder powder 52 stuck to the surface of the pad portion 16*a* is molten at a reflow step and is thus adhered to the surface of the pad portion 16*a*. In the embodiment, the solder powder 52 is temporarily stuck to the pad portion 16*a* as a previous step to the reflow step. The temporary sticking step serves to slightly melt the solder powder 52 and to stick the solder powder 52 thus molten to the pad portion 16*a*. Actually, it is possible to heat the substrate for approximately one hour in a heating furnace at approximately 170° C., thereby sticking the solder powder 52 temporarily. The masking tape 42 is peeled before the processing proceeds to the temporary sticking step. After the temporary sticking step, foreign matters are not stuck to the surface of the land pad 18 even if the land pad 18 is not coated with the masking tape 42.

Figure 9:
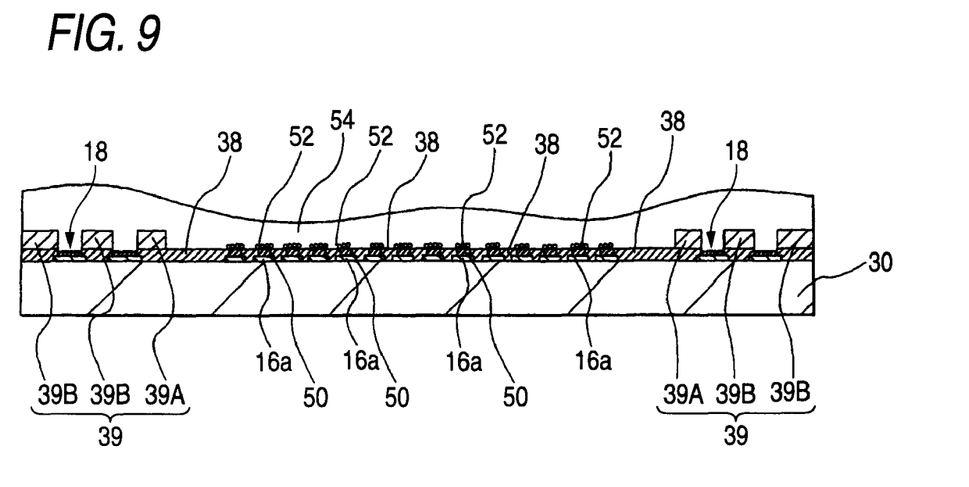
FIG. 9 is a sectional view showing a state in which the surface of the substrate is coated with a flux.

FIG. 9 is a sectional view showing a state in which the surface of the substrate is coated with a flux. In some cases, a step of coating the upper surface of the resin substrate 30 with a flux 54 as shown in FIG. 9 is carried out before the reflow step. The flux 54 serves to enhance a flowability of a solder 52*a* obtained by melting the solder powder 52 and a bonding property of the solder 52*a* and the pad portion 16*a*. For coating the flux 54, it is preferable to use a well-known method.

Figure 10:
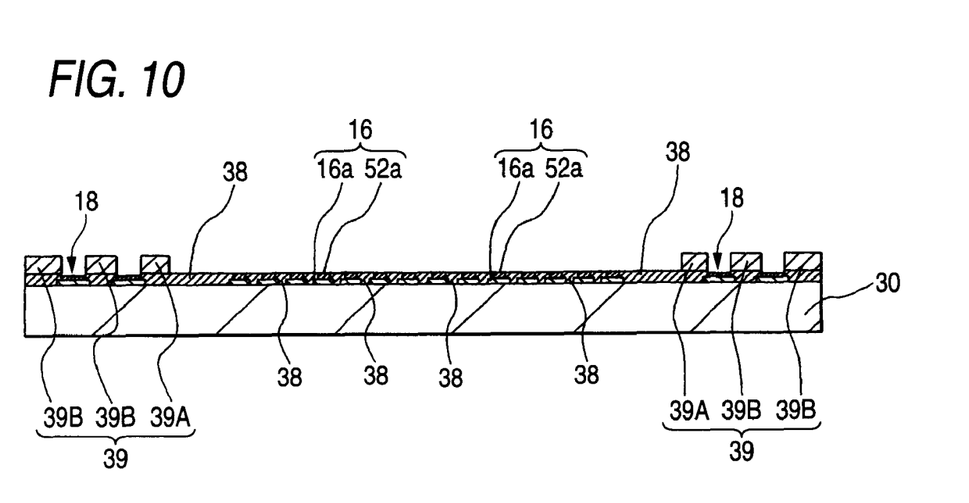
FIG. 10 is a sectional view showing a state in which a solder obtained by melting the solder powder is clad to the surface of the flip-chip connecting pad after a reflow step.
Figure 11A:
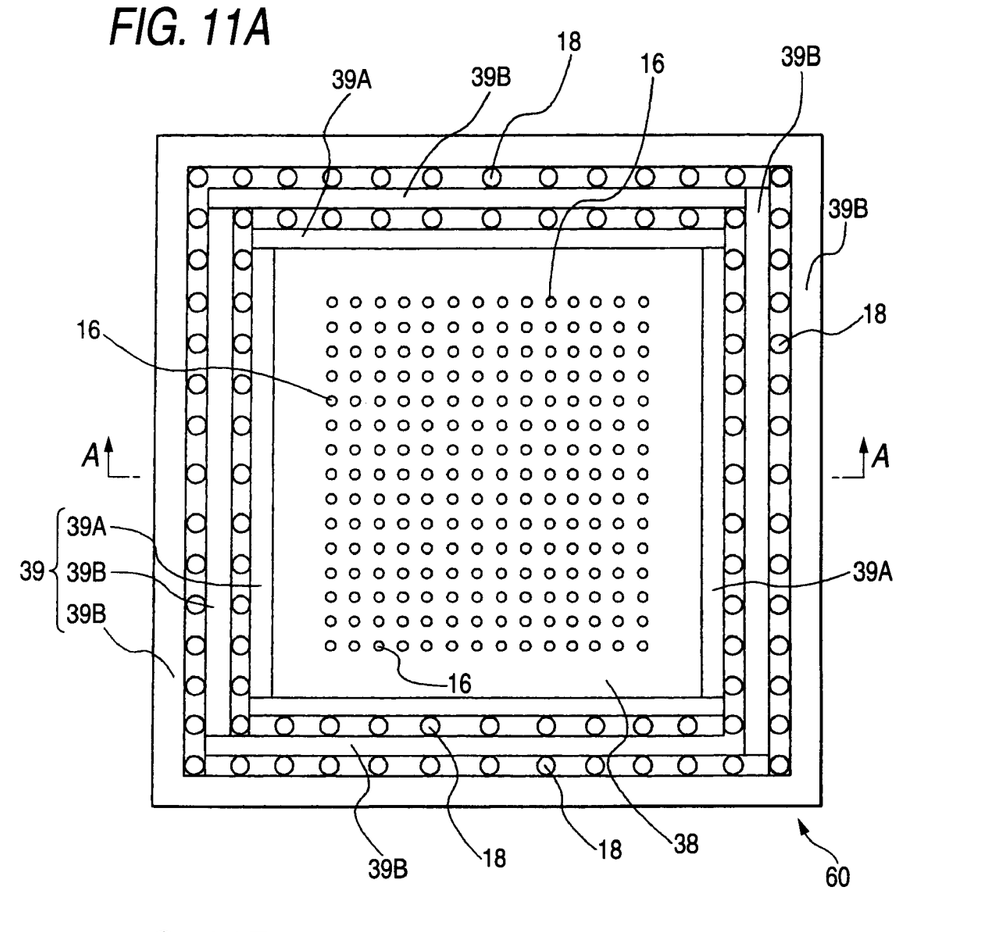
FIGS. 11A and 11B are sectional views showing a structure of a semiconductor package according to the embodiment.
Figure 11B:
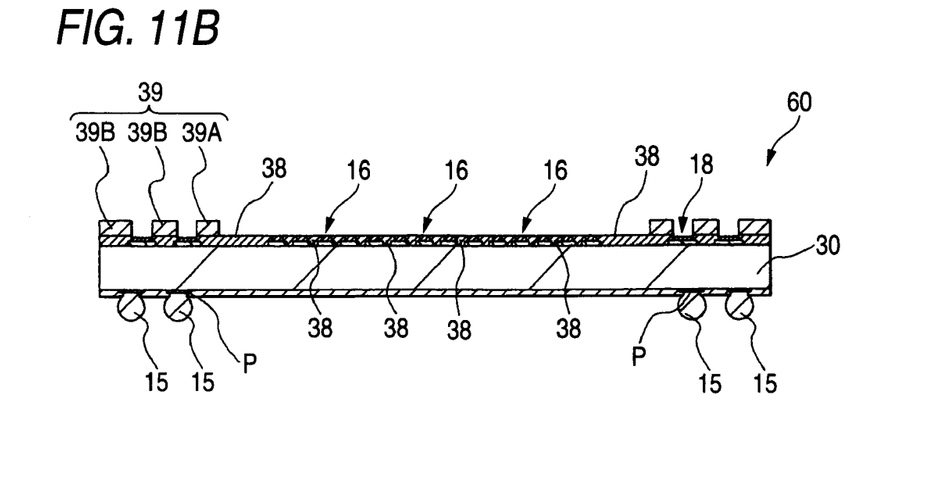

FIG. 10 is a sectional view showing a state in which the solder obtained by melting the solder powder is clad to the surface of the flip-chip connecting pad after the reflow step. After the flux 54 is coated, the processing proceeds to the reflow step in which the solder powder 52 is molten and the solder 52a is clad to the surface of the pad portion 16a serving as the flip-chip connecting pad 16. After the reflow step, the flux 54 is cleaned and removed.

For a method of sticking the solder powder 52 to the surface of the pad portion 16a through the sticking layer 50 and cladding the solder 52a to the surface of the pad portion 16a through the reflow, it is possible to utilize the method described in JP-A-7-7244 Publication, for example.

By forming the substrate including the flip-chip connecting pad 16 and the land pad 18 as described above and then attaching an external connecting terminal 15 to a pad P formed on a lower surface of the resin substrate 30, it is possible to obtain the semiconductor package 60 shown in FIGS. 11A and 11B. In the semiconductor package 60, the frame-shaped structure portion 39A and the support film portion 39B formed like a frame to surround the frame-shaped structure portion 39A on the outer side of the frame-shaped structure portion 39A are formed by the solder resist 39 to be the second layer which serves as the protecting member in order to expose the land pad 18 in the region in which the land pad 18 is formed which is positioned on the outside of the region in which the flip-chip connecting pad 16 is formed. In the semiconductor package 60 shown in FIGS. 11A and 11B, a frame member is formed by the support film portion 39B in two places.

Moreover, the frame-shaped structure portion 39A and the support film portions 39B and 39B surrounding the frame-shaped structure portion 39A are formed in equal heights to each other. When the solution of the adhesive is to be applied to the pad portion 16a of the flip-chip connecting pad 16, therefore, it is possible to reliably coat, with the masking tape 42, the region in which the land pad 18 is formed. Referring to the flip-chip connecting pad 16, consequently, the solder 52a can be clad to only the surface of the pad portion 16a. Referring to the land pad 18, furthermore, the predetermined plating 36 can be applied to only the surface of the pad portion 18a. Thus, it is possible to mount a semiconductor element or another semiconductor package through the flip-chip connection and the BGA connection or LGA connection.

The method of manufacturing the semiconductor package 60 according to the embodiment is characterized in that there is executed the step of adhering the masking tape 42 like a bridge to the frame-shaped structure portion 39A and the support film portion 39B formed in an equal height to that of the frame-shaped structure portion 39A in the arrangement surrounding the frame-shaped structure portion 39A, thereby sticking the masking tape 42 flatly, and forming the flip-chip connecting pad 16 in a state in which the land pad 18 is prevented from being exposed to an outside for the portion in which the land pad 18 is formed when forming the flip-chip connecting pad 16 and the land pad 18 in the resin substrate 30. By completely coating the land pad 18 with the masking tape 42 without a clearance, it is possible to reliably carry out a protection so as to prevent the solder from being clad to the land pad 18. Moreover, it is possible to easily carry out an operation for sticking the masking tape 42 to the frame-shaped structure portion 39A and the support film portion 39B or peeling the masking tape 42 from the frame-shaped structure portion 39A and the support film portion 39B.

In the method of manufacturing the semiconductor package 60, it is also possible to propose a method of applying a liquid resist to cover the land pad 18 as another method of coating the land pad 18 in order to clad the solder to the flip-chip connecting pad 16. In case of the method, however, it is necessary to apply the resist and to then expose, through exposure and development, the region in which the flip-chip connecting pad portion 16a is formed. There is a problem in that a productivity is deteriorated because of a complicated step. In the method, moreover, the resist layer is removed after the solder powder 52 is stuck. For this reason, there is a problem in that the solder powder 52 might be also removed when the resist layer is removed.

The method of manufacturing the semiconductor package 60 using the masking tape 42 is excellent in respect of no problem and is effective because it can suitably be utilized as an actual method of mass-producing the semiconductor package 60.

In the case in which the semiconductor element 10 is mounted on the semiconductor package 60, it is preferable to flip-chip connect the semiconductor element 10 to the flip-chip connecting pad 16 and to inject the underfill resin 37 into the bonding region of the semiconductor element 10 and the flip-chip connecting pad 16.

In some cases in which the underfill resin 37 is injected, outgassing is generated. The frame-shaped structure portion 39A and the support film portion 39B are protruded to higher positions than the surface position of the land pad 18 in the region in which the land pad 18 is formed. Therefore, it is possible to prevent the outgassing from coming in contact with the land pad 18, thereby protecting the surface of the land pad 18. Consequently, it is possible to suitably maintain the state of the surface treatment of the land pad 18 (for example, the nickel plating and the gold plating). FIG. 12 is a sectional view showing an example of the structure of the semiconductor device using the semiconductor package according to the embodiment.

The invention can be constituted as the semiconductor device 70 having a so-called POP structure in which semiconductor devices 70A and 70B formed as described above are laminated vertically as shown in FIG. 13. The semiconductor device 70B on a lower layer side and the semiconductor device 70A on an upper layer side can be electrically connected to each other through a solder ball 15A to be an external connecting terminal of the semiconductor device 70A on the upper layer side. The underfill resin 37 is prevented from flowing to the land pad 18 and a bonding property is maintained. Therefore, it is also possible to reliably carry out the electrical connection of the semiconductor devices 70A and 70B on the upper and lower layer sides.

Figure 13:
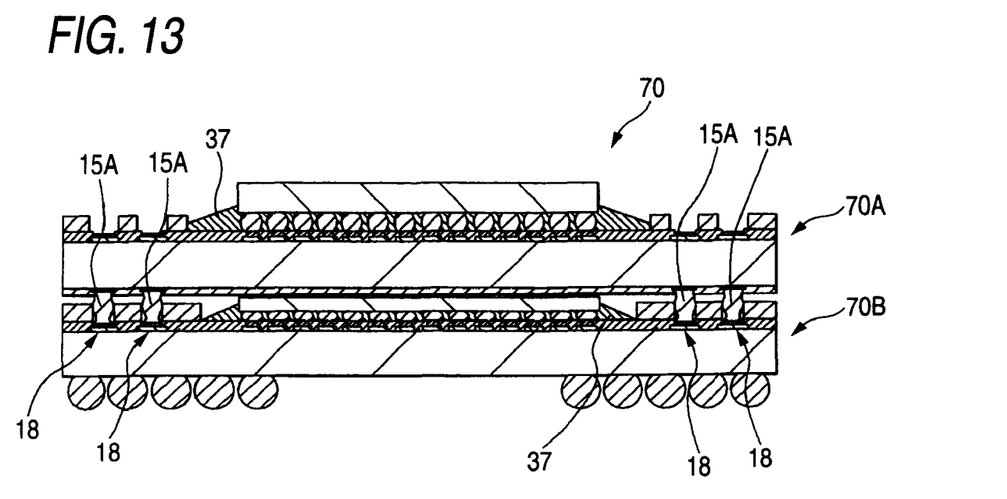
FIG. 13 is a sectional view showing a structure of a semiconductor device having a POP structure in which the semiconductor device according to the embodiment is laminated vertically.

As described above, the land pad 18 in the semiconductor device 70B on the lower layer side is protected from the outgassing from the underfill resin 37 in the injection of the underfill resin 37 through the frame-shaped structure portion 39A and the support film portion 39B. Therefore, it is possible to carry out a connection to the solder ball 15A in the semiconductor device 70A on the upper layer side and the land pad 18 of the semiconductor device 70B on the lower layer side in a high quality state. Thus, the reliability of the connection can be enhanced.

While the invention has been described above in detail based on the embodiment, the invention is not restricted to the embodiment but it is a matter of course that various changes can belong to the technical range of the invention without departing from the scope of the invention. Although the description has been given to the configuration in which the frame-shaped support film portion 39B having an equal height to that of the frame-shaped structure portion 39A and surrounding the frame-shaped structure portion 39A from the outside is formed when the masking tape 42 is stuck to the region in which the land pad 18 is formed in the embodiment, for example, the support film portion 39B does not always need to be formed like the frame. Moreover, the height of the support film portion 39B does not always need to be equal to that of the frame-shaped structure portion 39A within a range in which the advantages of the invention are produced.

It is sufficient that the support film portion 39B can flatly shield the inner part of the region in which the land pad 18 is formed with the masking tape 42 together with the frame-shaped structure portion 39A and maybe formed like a grid or a scattered point, and furthermore, it is also possible to employ a configuration in which the support film portion 39B is disposed in the whole inner part of the region in which the land pad 18 is formed and only the land pad 18 portion is exposed. In addition, it is also possible to employ a configuration in which a plurality of support film portions 39B is formed on the outer side of the frame-shaped structure portion 39A.

As a matter of course, moreover, it is possible to employ a wiring pattern of the support film portion 39B which can prevent the generation of the warpage in the semiconductor package 60 and the semiconductor device 70 in manufacture thereof.

Although the description has been given to the configuration in which the whole surface of the resin substrate 30 is coated with the solder resist 38 to be the first layer and exposure and development are carried out to expose only the pad portion 16a serving as the flip-chip connecting pad 16 and the pad portion 18a serving as the land pad 18 to the surface of the resin substrate 30 as shown in FIG. 4, and the solder resist to be the second layer is clad to the region in which the land pad 18 is formed so that the frame-shaped structure portion 39A and the support film portion 39B are formed as shown in FIG. 5 in the embodiment, furthermore, it is also possible to obtain the same functions and advantages as those of the embodiment by employing a configuration in which the solder resist 38 to be the first layer is not clad to the region in which the flip-chip connecting pad 16 is formed but the frame-shaped structure portion and the support film portion are formed by the solder resist 38 to be the first layer.

While the description has been given to the configuration in which the semiconductor package 60 mounted in an upper part of the substrate of the semiconductor package 60 mounts the semiconductor element 10 thereon through the BGA connection in the embodiment, moreover, it is a matter of course that the semiconductor element 10 in the semiconductor package 60 mounted on the upper part of the substrate of the semiconductor package 60 is connected through wire bonding in addition to the BGA connection.

While the single substrate portion or the semiconductor package has been described in the embodiment, it is also possible to manufacture, as a workpiece, the semiconductor package in which a large number of semiconductor packages 60 are fabricated into a large resin substrate and to divide the workpiece into pieces in a final manufacturing stage in an actual manufacturing process.

What is claimed is:

1. A semiconductor package comprising:
    a substrate including:
        a first region in which a land pad is formed, and
        a second region in which a flip-chip connecting pad is formed, the first region being provided on an outer side of the second region, and
    a protecting member formed to expose the land pad in the first region,
    wherein the protecting member includes:
        a frame-shaped structure portion disposed between the first region the second region so as to surround the second region, and
        a support film portion provided in a frame-shape so as to surround the first region along an outermost circumference of a surface of the substrate,
    wherein the land pad is exposed by a solder resist, and
    wherein the frame-shaped structure portion and the support film portion are provided on the solder resist.

2. The semiconductor package according to claim 1, wherein the support film portion surrounds the frame-shaped structure portion.

3. The semiconductor package according to claim 1, wherein the support film portion has a scattered point formation.

4. The semiconductor package according to claim 1, wherein the frame-shaped structure portion and the support film portion are formed in equal heights to each other.

5. A semiconductor device comprising:
    a substrate including:
        a first region in which a land pad is formed, and
        a second region in which a flip-chip connecting pad is formed, the first region being provided on an outer side of the second region,
    a semiconductor element mounted on the substrate through a flip-chip connection to the flip-chip connection pad, and
    a protecting member formed to expose the land pad in the first region,
    wherein the protecting member includes:
        a frame-shaped structure portion disposed between the first region the second region so as to surround the second region, and
        a support film portion provided in a frame-shape so as to surround the first region along an outermost circumference of a surface of the substrate,
    wherein the land pad is exposed by a solder resist, and
    wherein the frame-shaped structure portion and the support film portion are provided on the solder resist.

6. The semiconductor device, according to claim 5 further comprising a first semiconductor device and a second semiconductor device,
    wherein the first semiconductor device and the second semiconductor device are laminated in a vertical direction such that the first semiconductor device constitutes an upper layer and the second semiconductor device constitutes a lower layer, and
    wherein an external connecting terminal formed on a lower surface of the substrate on the first semiconductor device is connected to a land pad in the second semiconductor device.

7. The semiconductor package according to claim 1,
    wherein the land pad includes an inner land pad and an outer land pad,
    wherein the frame-shaped structure portion is disposed along a circumference of the flip-chip connecting pad and along an inner edge of the inner land pad, and
    wherein the support film portion includes a first support film portion disposed between the inner land pad and the outer land pad and a second support film portion disposed along an outer edge of the outer land pad.

* * * * *